United States Patent
Phillips

(10) Patent No.: US 6,433,976 B1
(45) Date of Patent: Aug. 13, 2002

(54) INSTANTANEOUS ARC FAULT LIGHT DETECTOR WITH RESISTANCE TO FALSE TRIPPING

(75) Inventor: Timothy B. Phillips, Raleigh, NC (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/404,896

(22) Filed: Sep. 24, 1999

(51) Int. Cl.[7] .................................................. H02H 3/00
(52) U.S. Cl. ............................................................ 361/42
(58) Field of Search .............................. 340/635–642; 250/227.11, 227.24, 239; 324/536, 418–434; 361/91.4, 1–13, 42, 62, 78; 335/201

(56) References Cited

U.S. PATENT DOCUMENTS

| | | | |
|---|---|---|---|
| 4,241,455 A | * 12/1980 | Eibner ......................... 455/600 |
| 4,516,022 A | 5/1985 | Lindgren | |
| 4,658,322 A | * 4/1987 | Rivera ........................... 361/37 |
| 4,702,553 A | * 10/1987 | Buchmuller et al. ..... 350/96.29 |
| 4,791,518 A | * 12/1988 | Fischer ......................... 361/42 |
| 5,170,050 A | 12/1992 | Giboulet et al. | |
| 5,650,902 A | 7/1997 | Herkenrath et al. | |
| 5,680,246 A | * 10/1997 | Takahashi et al. .......... 359/341 |
| 5,933,308 A | * 8/1999 | Garzon ......................... 361/62 |
| 6,229,680 B1 | * 5/2001 | Shea ............................. 361/42 |

OTHER PUBLICATIONS

ABB Power Dist. Co., It's only a matter of milliseconds . . ., Feb. 13, 1995, pp. 1–7.

* cited by examiner

*Primary Examiner*—Ronald W. Leja
(74) *Attorney, Agent, or Firm*—David R. Stacey; Larry T. Shrout; Larry I. Golden

(57) ABSTRACT

The present invention discloses an improved arc fault detection circuit comprising a light detector for generating a light detector signal, a differentiator circuit for receiving a light detector signal and creating a differentiated light detector signal, and a comparator circuit for comparing the differentiated light detector signal and a reference signal and generating a comparator output signal for indicating when the differentiated light detector signal exceeds the reference signal.

22 Claims, 3 Drawing Sheets

INSTANTANEOUS ARC FAULT LIGHT DETECTOR WITH RESISTANCE TO FALSE TRIPPING

TECHNICAL FIELD

This invention relates to electrical switchgear. More specifically, it relates to electrical switchgear with arc fault light detectors.

BACKGROUND OF THE INVENTION

In the past, several products have been designed to detect the light caused by an arc in electrical switchgear and terminate that arc as quickly as possible. These products operate by detecting a magnitude of light above a fixed threshold to determine the presence of an arc. When the presence of an arc is detected, the circuit indicates such and a mechanism is actuated to remove the source voltage.

Unfortunately, an arc does not produce light with a high content of radiation in the infrared frequency range. This is the range most easily detected by conventional light detectors, such as photodiodes and phototransistors. Therefore, the signal detector has to be set so as to be very sensitive in order to detect an arc before it becomes too destructive.

However, flashlights, sunlight, and building light sources have a much greater infrared content. Even though the absolute level of light from these sources is typically much lower, when conventional light detectors are subjected to these sources it can cause an erroneous detection of a arc. The source voltage is then erroneously tripped and must be reset. This erroneous detection is exacerbated by the need to set the detector to be very sensitive.

Therefore, there is a need for an improved switchgear arc fault detection circuit. The present invention is provided to solve this and other problems.

SUMMARY OF THE INVENTION

The present invention provides an improved electrical circuit for detecting an arc fault in electrical switchgear. To this end, there is provided a circuit which comprises a light detector which generates a light detector signal in response to the amount of light detected. A differentiator circuit receives the light detector signal and differentiates the light detector signal over time to generate a differentiated light detector signal. A comparator circuit then compares the differentiated light detector signal to a reference signal and generates an output signal when the differentiated light detector signal exceeds the reference value.

In an alternative embodiment, a second comparator circuit and a logic circuit are added to the circuit. The comparator circuit compares the light detector signal to a second reference signal and generates a second comparator output signal when the light detector signal exceeds the reference signal. The comparator output signal and the second comparator output signal are connected together in such a way as to provide a logical AND operation. The comparator and the second comparator outputs generate a trip signal only when both comparator outputs are activated.

DETAILED DESCRIPTION OF THE INVENTION

Figure 1:
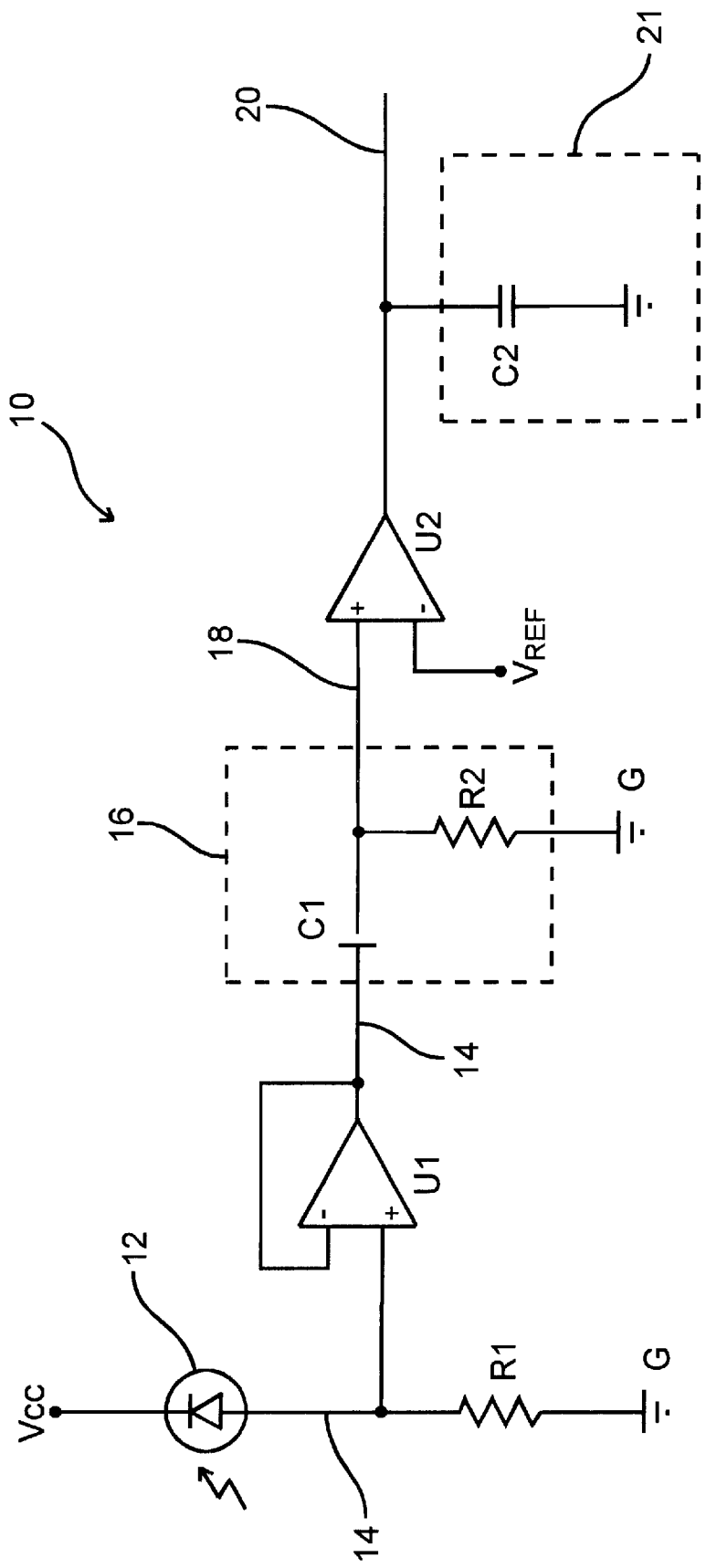
FIG. 1 is a diagram of an electrical circuit according to a first embodiment of the present invention.

While the invention is susceptible of embodiment in many different forms, there is shown in the drawings and will herein be described in detail a preferred embodiment of the invention. It is to be understood that the present disclosure is to be considered only as an example of the principles of the invention. This disclosure is not intended to limit the broad aspect of the invention to the illustrated embodiments. The scope of protection should only be limited by the accompanying claims.

Referring to FIG. 1, there is provided an electrical circuit 10 having a light detector 12 and a resistor R1 connected in series between a voltage source Vcc and ground G. The light detector 12 may be any commercially available light detector and may have an internally adjustable or fixed signal gain. The light detector 12 generates a light detector output signal 14 which corresponds to the amount of light to which the light detector 12 is exposed. The value of R1 is selected to deliver a voltage across R1 that is suitable for processing by the remaining circuitry given the range of light to be detected.

A buffer U1 is connected at a point between RI and the light detector 12 to receive the light detector output signal 14. Because the buffer U1 has unity gain, its output and input are identical. A differentiator 16 receives the light detector output signal 14. Preferably, the differentiator 16 is a RC high pass filter comprising a resistor R2 and a capacitor C1. RC high pass filters are well known in the art. The resistor R2 and the capacitor C1 are selected such that the cutoff frequency of the filter is 1.5 kHz. This type of differentiator is preferred due to its simple and inexpensive structure. However, there are numerous types of differentiators, and any type of differentiator may be used in accordance with the present invention. The output of the differentiator 16 is a differentiated light detector signal 18.

A comparator U2 is connected to the differentiator 16 output to receive the differentiated light detector signal 18. The comparator U2 compares the differentiated light detector signal 18 to a reference voltage Vref. The proper value of reference voltage Vref will vary depending on the values of the resistor and capacitor chosen for the differentiator and the desired sensitivity of the circuit to changes in the light detected. When the value of the differentiated light detector signal 18 is larger than the value of the reference voltage Vref, the comparator will generate a comparator output signal 20 indicating that an arc fault has been detected.

In a system incorporating alternating current, arc faults are not continuous arcs, but are intermittent arcs. An arc generated by a sinusoidal alternating voltage source will occur whenever the voltage is near its peak. Therefore, the light created by an arc fault is not continuous, but rather a short pulse of light which occurs every half cycle of the alternating voltage source (i.e. an arc occurs at the voltage's sinusoidal peak and at the voltage's sinusoidal trough). As a result, the comparator output signal 20 will pulse in unison with the detected light from the arc fault. However, it is normally desired that the comparator output signal 20 remain active during an entire arc fault episode and not return to an inactive state during points of the voltage source's sinusoidal zero-crossing. As a result, a pulse extender circuit 21 may optionally be used with the present invention. The pulse extender circuit 21 is preferably a capacitor C2 having a large value of capacitance which is connected between the comparator output signal 20 and a ground point G of the circuit. The capacitor C2 charges during peaks of the comparator output signal 20 and discharges during troughs of the comparator output signal 20, thereby holding the comparator output signal 20 active during the period between arc faults.

Figure 2:
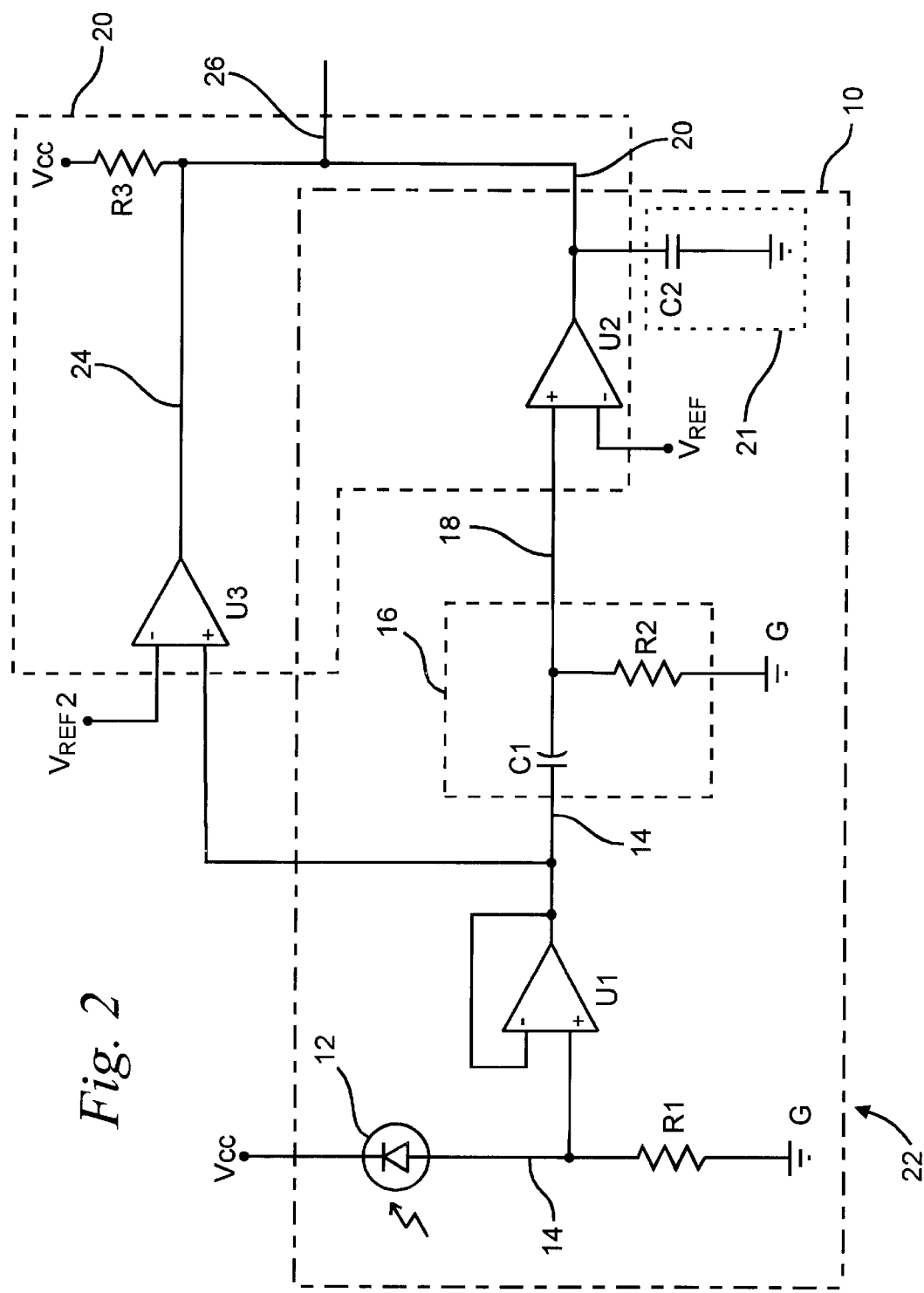
FIG. 2 is a diagram of an electrical circuit according to a second embodiment of the present invention.

Referring to FIG. 2, a circuit 22 is provided. The circuit 22 comprises the circuit 10 of FIG. 1 with two additional components—a second comparator U3 and a logic circuit 23. The second comparator U3 is connected to the output of the buffer U1 and a second reference voltage signal Vref2. When the output of the buffer U1 (the light detector signal 14) exceeds the reference voltage Vref2, the second comparator U3 provides a second comparator output signal 24 which indicates a threshold light value has been reached.

In the circuit 22 of FIG. 2, the comparator output signal 20 and the second comparator output signal 24 are attached across a resistor R3 to the voltage source Vcc to form a trip indicator output signal 26. If the comparators U1, U2 are open collector operational amplifiers, when only one of comparator U1 or second comparator U2 is high, the voltage of the trip indicator output signal 26 is low. When both comparators U1, U2 are high, the voltage of the trip indicator output signal 26 is high. As a result comparators U1, U2 and resistor R3 act to form the logic circuit 23 which performs a logical AND operation. While in the present embodiment open collector operational amplifiers are used with resistor R3 as the logic circuit 23, the logic circuit 23 could be implemented in many other ways by one of ordinary skill in the art, such as with truth table logic circuits.

Figure 3:
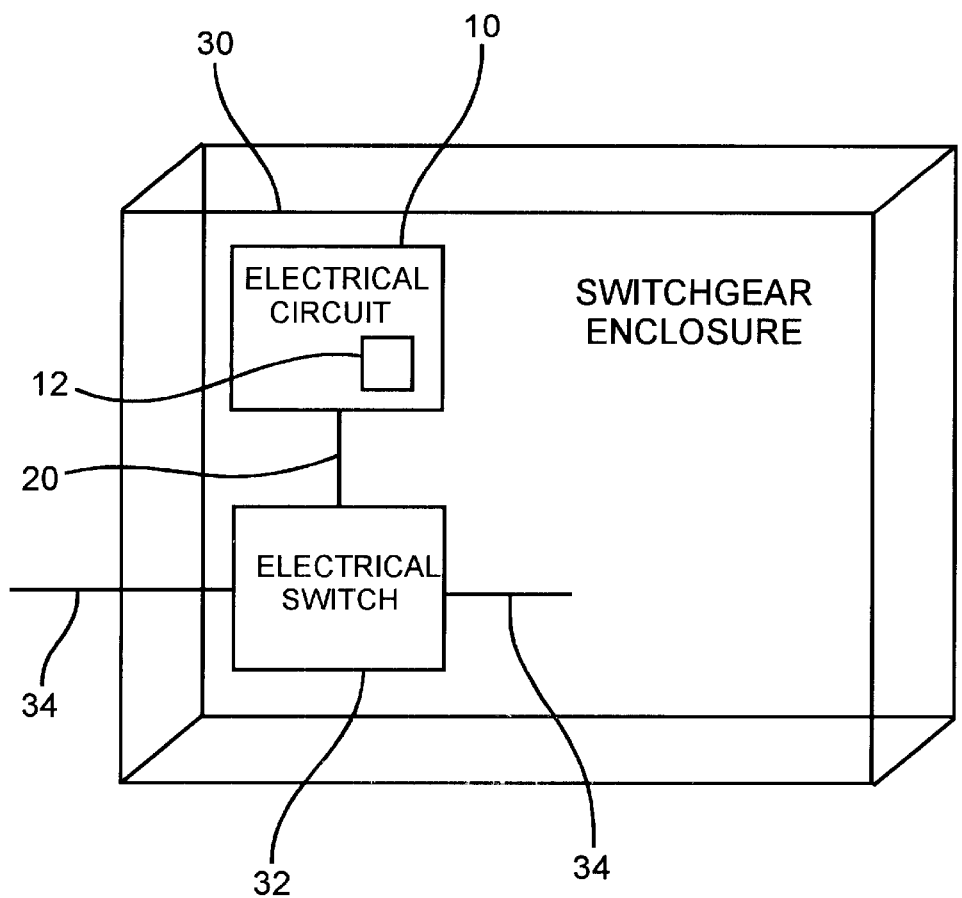
FIG. 3 is a diagram of the electrical circuit of FIGS. 1 or 2 incorporated within electrical switchgear.

With reference to FIG. 3, the circuit 10 of the present invention is located inside a switchgear enclosure 30. The light detector 12 is situated inside a switchgear enclosure 30 such that light from an arc fault, if one occurred, would be cast upon the light detector 12. More than one light detector 12 and/or light detector circuit 10 can be placed within the switchgear enclosure 30 in locations prone to arc faults. An electrical switch 32 inside the switchgear enclosure 30 receives the comparator output signal 20 of the circuit 10. In response to comparator output signal 20, the electrical switch 32 interrupts power coming into the switchgear enclosure 30 through an electrical line 34. The circuit 10 and the comparator output signal 20 can be replaced by the circuit 22 and the trip indicator output signal 26, respectively.

While the specific embodiments have been illustrated and described, numerous modifications come to mind without significantly departing from the spirit of the invention, and the scope of protection is only limited by the scope of the accompanying claims.

I claim:

1. An improved arc fault detection circuit comprising:
   a light detector for generating a light detector signal in response to light emitted by an arcing fault;
   a differentiator circuit for receiving the light detector signal and creating a differentiated light detector signal; and
   a comparator circuit for comparing the differentiated light detector signal and a reference signal, and generating a comparator output signal when the differentiated light detector signal exceeds the reference signal, thereby indicating a detected arc fault.

2. The improved arc fault detection circuit of claim 1 wherein the differentiator circuit is a high pass filter comprising a resistor and capacitor.

3. The improved arc fault detection circuit of claim 1 further comprising a pulse extender circuit.

4. The improved arc fault detection circuit of claim 3 wherein the pulse extender circuit includes a capacitor for maintaining the comparator output signal in an active state during the entire arc fault.

5. The improved arc fault detection circuit of claim 1 further comprising:
   a second comparator circuit for comparing the light detector signal to a second reference signal and generating a second comparator output signal for indicating when the light detector signal exceeds the second reference signal; and
   a logic circuit for receiving the comparator output signal and the second comparator output signal and generating a logic circuit output signal when the comparator output circuit signal and the second comparator output signal exceed a threshold value.

6. An improved switchgear comprising:
   a light detector for generating a light detector signal in response to light emitted by an arcing fault;
   a differentiator circuit for receiving the light detector signal and creating a differentiated light detector signal;
   a comparator circuit for comparing the differentiated light detector signal and a reference signal and generating a comparator output signal when the differentiated light detector signal exceeds the reference signal, thereby indicating a detected arc fault; and
   an electrical switch responsive to the comparator circuit output signal for disconnecting an arc fault source voltage.

7. The improved switchgear of claim 6 wherein the differentiator circuit is a high pass filter comprising a resistor and capacitor.

8. The improved switchgear of claim 6 further comprising a pulse extender circuit.

9. The improved switchgear circuit of claim 8 wherein the pulse extender circuit includes a capacitor for maintaining the comparator output signal in an active state during the entire arc fault.

10. An improved switchgear comprising:
    a light detector for generating a light detector signal in response to light emitted by an arcing fault;
    a differentiator circuit for receiving the light detector signal and creating a differentiated light detector signal;
    a comparator circuit for comparing the differentiated light detector signal and a reference signal and generating a comparator output signal when the differentiated light detector signal exceeds the reference signal;
    a second comparator circuit for comparing the light detector signal to a second reference signal and generating a second comparator output signal when the light detector signal exceeds the second reference signal;
    a logic circuit for receiving the comparator output signal and the second comparator output signal and generating a logic circuit output signal when the comparator output signal and the second comparator output signal each exceed their respective reference signal value, thereby indicating a detected arc fault; and
    an electrical switch responsive to the logic circuit output signal for disconnecting an arc fault source voltage.

11. The improved switchgear of claim 10 wherein the differentiator circuit is a high pass filter comprising a resistor and capacitor.

12. The improved switchgear of claim 10 further comprising a pulse extender circuit.

13. The improved switchgear circuit of claim 12 wherein the pulse extender circuit includes a capacitor for maintaining the comparator output signal in an active state during the entire arc fault.

14. An arc fault detection circuit for distinguishing light emitted by an arcing fault from light emitted by other sources, the arc fault detection circuit comprising:

a light detector set to high sensitivity for generating a light detector signal in response to detected light including light emitted by an arcing fault;

a differentiator circuit for receiving the light detector signal and creating a differentiated lift detector signal; and a comparator circuit for comparing the differentiated light detector signal and a reference signal, and generating a comparator output signal when the differentiated light detector signal exceeds the reference signal, thereby indicating a detected arc fault.

15. The arc fault detection circuit of claim 14, wherein the differentiator circuit differentiates the light detector signal with respect to time.

16. An arc fault detection circuit for distinguishing light emitted by an arcing fault from light emitted by other sources, the arc fault detection circuit comprising:

a light detector set to high sensitivity for generating a light detector signal;

a differentiator circuit for receiving the light detector signal, differentiating the light detector signal with respect to a particular characteristic of light emitted by an arcing fault and creating a differentiated light detector signal; and a comparator circuit for comparing the differentiated light detector signal and a reference signal, and generating a comparator output signal when the differentiated light detector signal exceeds the reference signal, thereby indicating a detected arc fault.

17. The arc fault detection circuit of claim 16, wherein the differentiator circuit differentiates the light detector signal with respect to time.

18. The arc fault detection circuit of claim 16, further includes a pulse extender circuit.

19. The arc fault detection circuit of claim 18 wherein the pulse extender circuit includes a capacitor for maintaining the comparator output signal in an active state during the entire arc fault.

20. The arc fault detection circuit of claim 16, further includes a second comparator for comparing the light detector signal with a reference value and generating a second comparator output signal.

21. The arc fault detection circuit of claim 20, further includes a logic circuit for receiving the comparator output signal and the second comparator output signal and generating a logic circuit output signal when both the comparator output signal and the second comparator output signal exceed their respective reference signal.

22. The arc fault detection circuit of claim 21, wherein an electrical switch, responsive to the logic circuit output signal, can interrupt the arc fault voltage supply.

* * * * *